(12) United States Patent
Hwang et al.

(10) Patent No.: US 7,613,063 B2
(45) Date of Patent: Nov. 3, 2009

(54) INTERNAL POWER VOLTAGE GENERATING CIRCUIT IN SEMICONDUCTOR MEMORY DEVICE

(75) Inventors: Hyong-Ryol Hwang, Seoul (KR); Ki-Ho Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 433 days.

(21) Appl. No.: 11/646,543

(22) Filed: Dec. 28, 2006

(65) Prior Publication Data

US 2007/0195630 A1 Aug. 23, 2007

(30) Foreign Application Priority Data

Feb. 22, 2006 (KR) ...................... 10-2006-0017105

(51) Int. Cl.
*G11C 5/14* (2006.01)
(52) U.S. Cl. ................. 365/226; 365/189.09; 365/233.1
(58) Field of Classification Search ............ 365/189.09, 365/203, 226, 227, 228, 229, 233.1
See application file for complete search history.

(56) References Cited

U.S. PATENT DOCUMENTS

| 6,097,659 | A | 8/2000 | Kang |
| 6,492,850 | B2 | 12/2002 | Kato et al. |
| 6,522,193 | B2 | 2/2003 | Shin |
| 6,784,704 | B2 | 8/2004 | Sato |
| 6,795,366 | B2 * | 9/2004 | Lee ............................ 365/226 |
| 6,937,074 | B2 | 8/2005 | Shin |
| 6,996,023 | B2 * | 2/2006 | Kim ........................... 365/226 |
| 2004/0042319 | A1 * | 3/2004 | Lee ............................ 365/226 |

* cited by examiner

*Primary Examiner*—VanThu Nguyen
(74) *Attorney, Agent, or Firm*—Volentine & Whitt, PLLC (57) ABSTRACT

A method and circuit are disclosed for generating an internal power voltage in a semiconductor memory device. The method includes receiving an external power voltage in an internal power voltage generating circuit and activating a power-up signal during a first period in the applied external power voltage rising to a desired level, powering-up the internal power voltage in relation to the external power voltage during the first period, and continuing the power-up of the internal power voltage during a second period following the first period, the second period extending beyond the deactivation of the power-up signal until receipt of an active command signal.

10 Claims, 12 Drawing Sheets

INTERNAL POWER VOLTAGE GENERATING CIRCUIT IN SEMICONDUCTOR MEMORY DEVICE

BACKGROUND OF THE INVENTION

1. Technical Field

The present invention relates to a power voltage generating circuit, and more particularly, to an internal power voltage generating circuit for use in high-speed semiconductor memory devices.

This application claims the benefit of Korean Patent Application No. 10-2006-0017105, filed Feb. 22, 2006, the subject matter of which is hereby incorporated by reference in its entirety.

2. Discussion of Related Art

As the integration density of a semiconductor memory device increases and its operating speed increases, the internal power supply voltages variously applied to circuits within the memory device should be as low as reasonably possible. Reduced internal power supply voltages tend to improve reliability and power consumption. As a result, internal power voltage generating circuit(s) adapted to drop an externally provided and relatively high power supply voltage are often provided in memory devices. In particular, memory devices such as a DRAM, for example, routinely include an internal power voltage generating circuit adapted to convert an external power supply voltage to an internal power supply voltage. One example is shown in FIG. 1.

Figure 1:
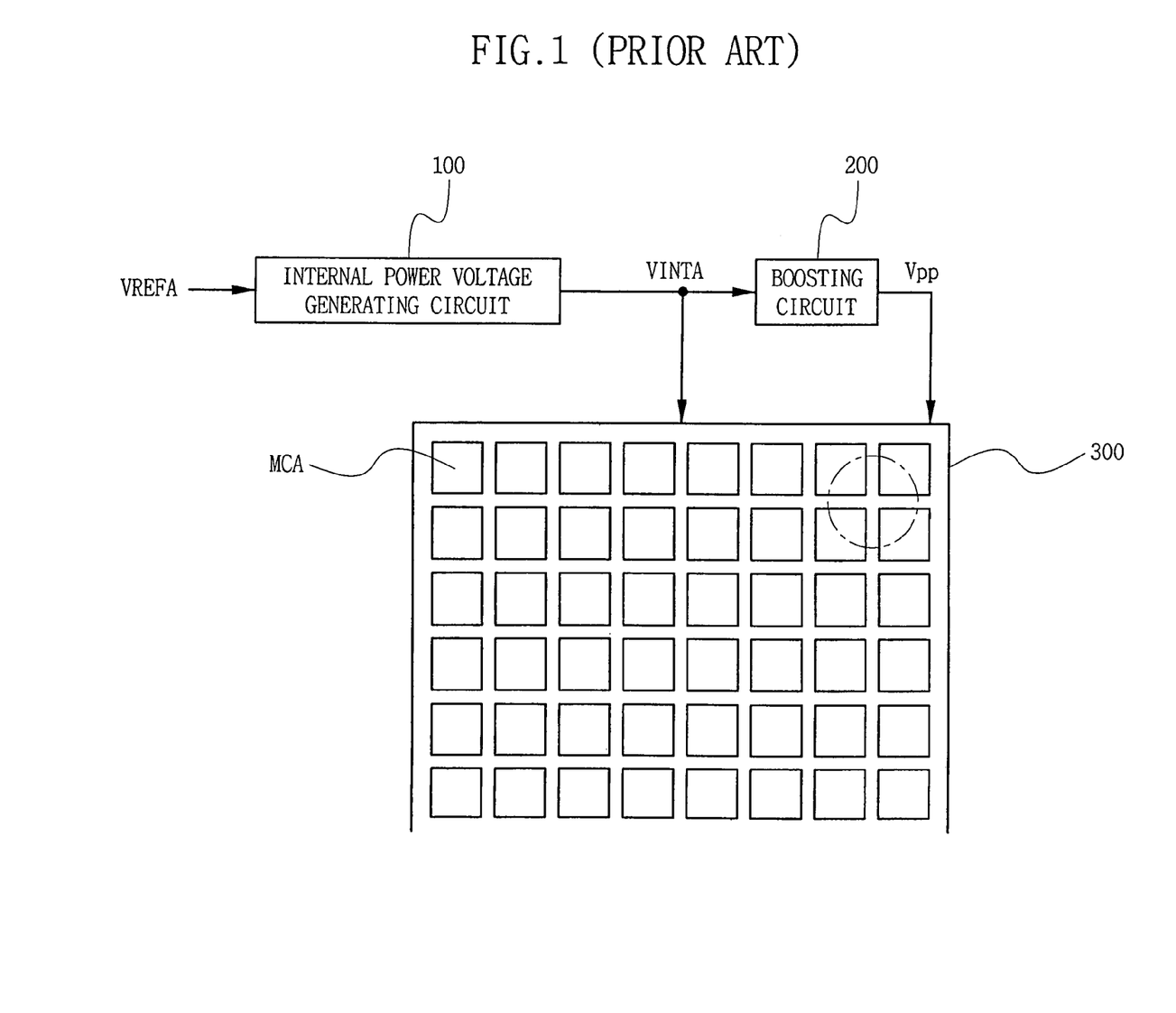
FIG. 1 is a circuit block diagram illustrating a voltage generation and supply in a conventional semiconductor memory device.

Referring to FIG. 1, a general relationship between an internal voltage generating circuit 100 and a memory cell array (MCA) region 300 is illustrated. MCA region 300 comprises an array of memory cell arrays formed in a conventional row/column arrangement. Here, internal voltage generating circuit 100 receives, in addition to an external power supply voltage Vcc (hereafter referred to as VEXT), a reference voltage VREFA and generates an internal power voltage VINTA. The internal power voltage VINTA is applied to a boosting circuit 200 which generates a boosted voltage (Vpp) applied to MCA 300.

Reference voltage VREFA acts as a control signal adapted to adjust an action current developed by internal voltage generating circuit 100 in order to properly generate the internal power voltage (internal Vcc: VINTA). Boosting circuit 200 boosts the internal power voltage VINTA, and applies the resulting boosted voltage Vpp to MCA 300.

A sense amplifier is typically associated with each memory cell array in MCA region 300 in a columnar arrangement. A sub-word line driver is also associated with each memory cell array in a row-wise arrangement. The area indicated within the dotted line circle apparent in FIG. 1 is a so-called conjunction region disposed between the sense amplifier and the sub-word line driver. The connection and physical arrangement of these peripheral circuits to each memory cell array are conventionally understood.

In FIG. 1, the internal power voltage VINTA generated by internal voltage generating circuit 100 is applied to the memory arrays of MCA 300. However, it is common to provide other internal power voltages to the peripheral circuits, such as the sense amplifier, sub-word driver, output driver, and/or output buffer circuits. These other internal power voltages are usually separately generated, and may be independently controlled.

For example, boosted voltage Vpp generated by boosting circuit 200 may be used to power a gating circuit, row driver circuit, and a clock driver circuit in DRAM and/or SRAM devices. Even though internal voltage generating circuit 100 is shown as a block level component in FIG. 1, it may be variously implemented. For example, internal voltage generating circuit 100 may include an active power voltage generator operating during an active operating mode for the memory device and providing improved driving capabilities, and a stand-by power voltage generator operating during a stand-by mode to decrease overall power consumption.

Figure 2:
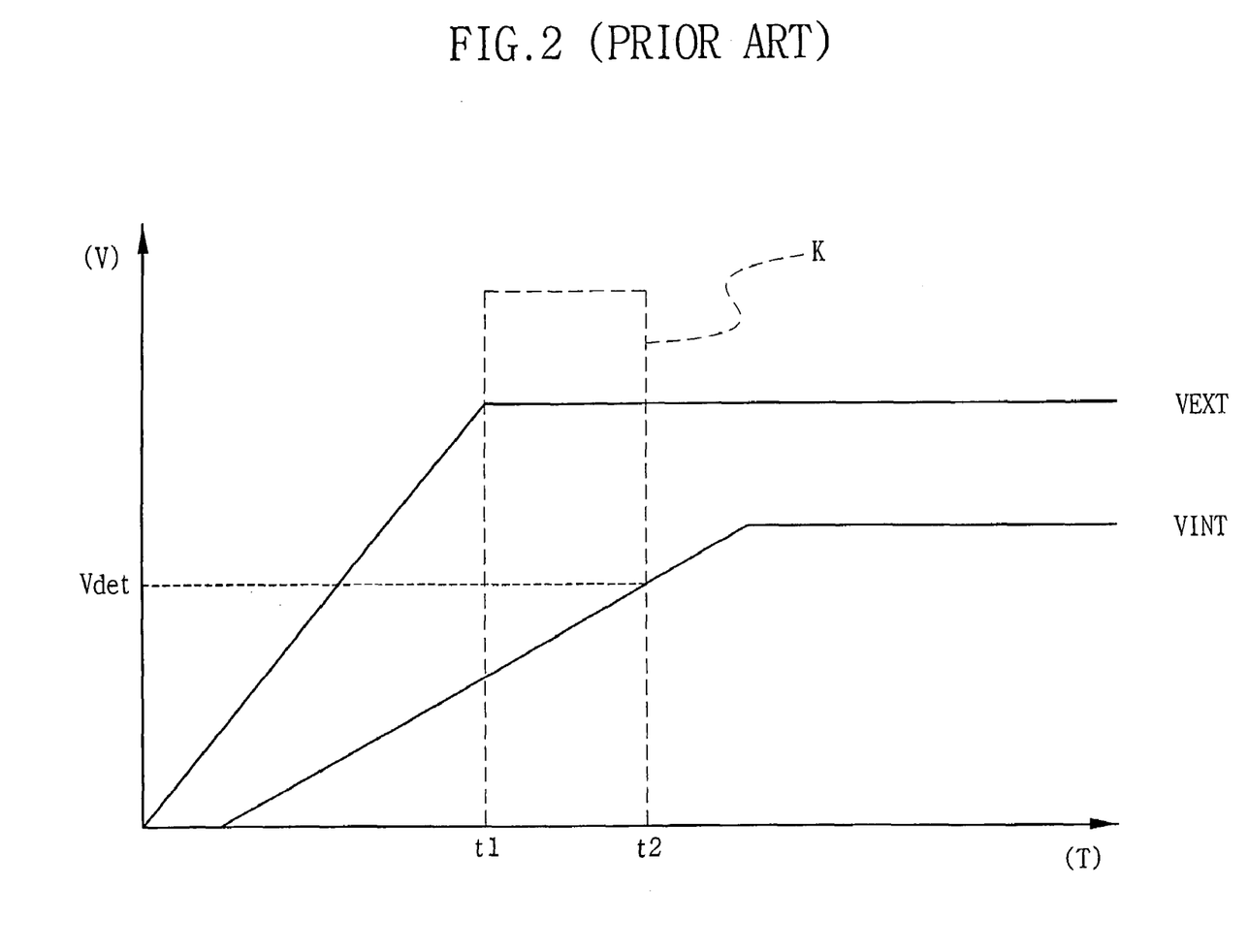
FIG. 2 is a graph comparing a rising slope of an internal power voltage generated at FIG. 1 with a rising slope of an external power voltage.

FIG. 2 is a graph comparing the rising slope of an internal power voltage VINT with the rising slope of the external power supply voltage VEXT. Referring to FIG. 2, a power-up signal VCCH (or its inverse) is generated by a power-up signal generating circuit and immediately applied within the memory device when the device receives external provided power. That is, power-up signal VCCH transitions from a low level to a high level upon power-up and remains high, driving external power voltage VEXT, until the external power voltage VEXT is applied at its desired level to the memory device at time t1.

The level of the internal power voltage VINT increases with the external power voltage VEXT up to a saturation point at time t2. That is, prior to time t1, internal voltage generating circuit 100 receives the reference voltage VREFA and the external power voltage VEXT and generates the internal power voltage VINTA in relation to reference voltage VREFA, such that internal power voltage VINTA increases according to the increase of the external power voltage VEXT as shown in FIG. 2.

The level of the external power voltage VEXT under the influence of power-up signal VCCH until its saturation point at time t1, at which point the power-up signal VCCH transitions back to a low level. However, the level of the internal power voltage VINT continues to rise up to its saturation point well past time t1. This power-up timing difference may cause operating problems within the memory device, particularly when the relative power-up slews between the internal power voltage VINT and the external power voltage VEXT are significantly different. For example, the internal power voltage VINT may not reach a prescribed minimum operating threshold before the memory device begins operation.

Figure 3:
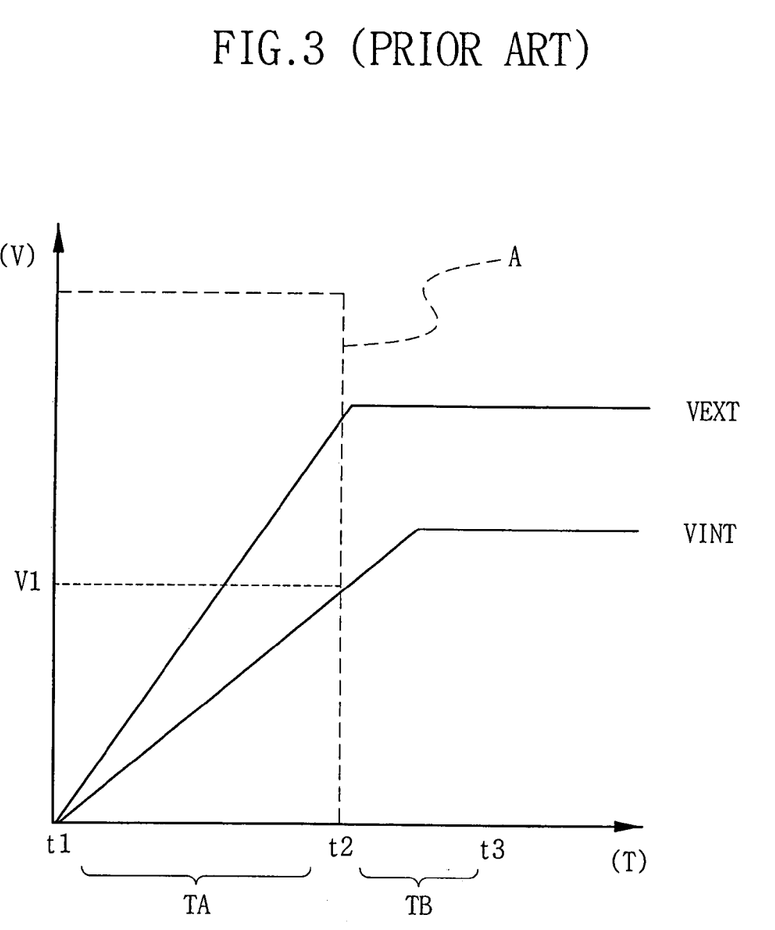
FIG. 3 is a graph illustrating a power-up slope reinforcement of the internal power voltage circuit according to a conventional semiconductor memory device.

FIG. 3 is a graph illustrating relative power-up slopes for the internal power voltage VINT and the external power voltage VEXT under conditions where the development of the internal power voltage VINT is reinforced. In this example, it is assumed that both stand-by and active internal power voltage generating circuits are operated in tandem to increase the power-up slope for the internal power voltage VINT (Another voltage reinforcing scheme might be similarly used). The application of a reinforcing voltage to the internal power voltage VINT occurs during a power-up period TA that ends at time t2 when the power-up signal VCCH transitions to low, as above.

In effect, the power-up slope for the internal power voltage VINT is improved during power-up period TA. Nonetheless, the voltage power-up operation for the internal power voltage generator is yet halted upon transition of the power-up signal VCCH at time t2, after which the power-up slope for the internal power voltage VINT is no longer improved. In the example illustrated in FIG. 3, an active command signal, (e.g., an all bank precharge signal) is applied within the memory device at time t3 which is separated from time t2 by a period TB.

Thus, while the power-up slope for the internal power voltage VINT shown in FIG. 3 is improved over that of FIG. 2, it's characteristic voltage reinforcing effects are limited by the activation period of the power-up signal VCCH. As the operating speed of constituent memory devices increases the allowable "wait" time (e.g., period TB) between transition of the power-up signal VCCH and a first active

DESCRIPTION OF EMBODIMENTS

Embodiments of the invention will be described with reference to accompanying drawings. However, the invention is not limited to only the illustrated embodiments but may be variously embodied.

Figure 4:
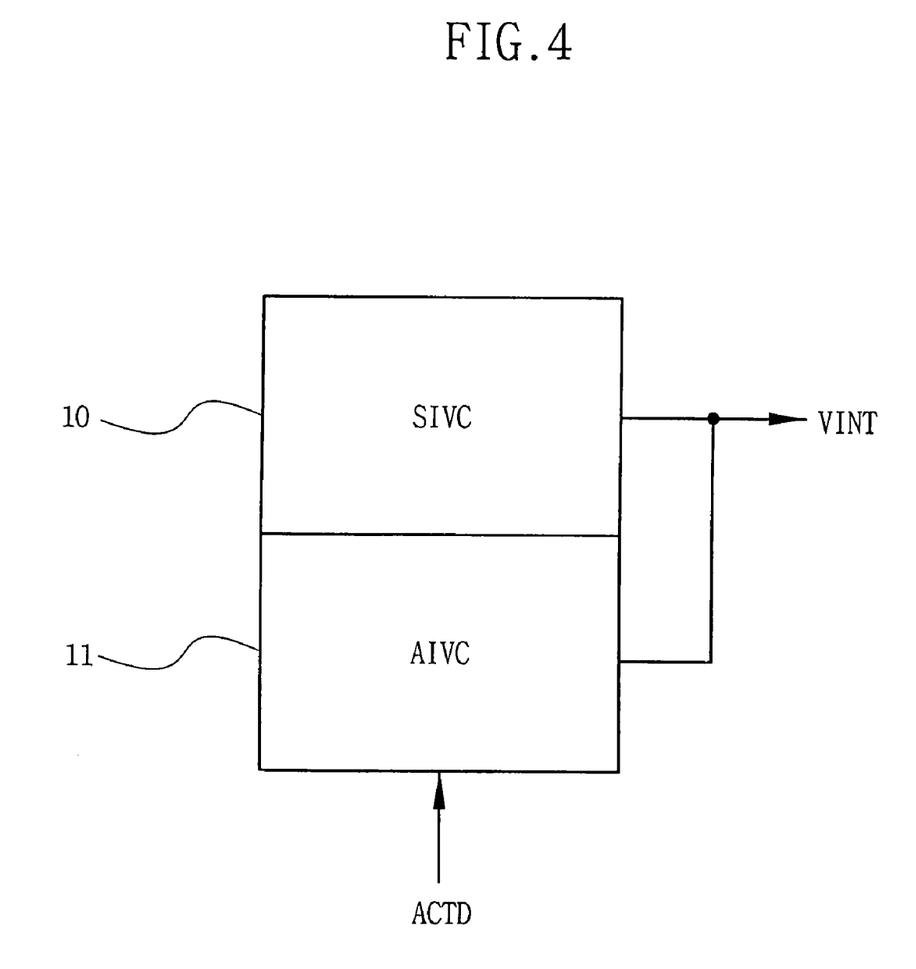
FIG. 4 is a block diagram illustrating an internal power voltage generator according to an embodiment of the invention.

FIG. 4 is a block diagram illustrating an internal power voltage generator according to an embodiment of the invention. Referring to FIG. 4, an active internal power voltage generator 11 and a stand-by internal power voltage generator 10 are commonly connected to an output pad providing an internal power voltage VINT. An active control signal ACTD is applied to active internal power voltage generator 11 from a competent control circuit.

Figure 5:
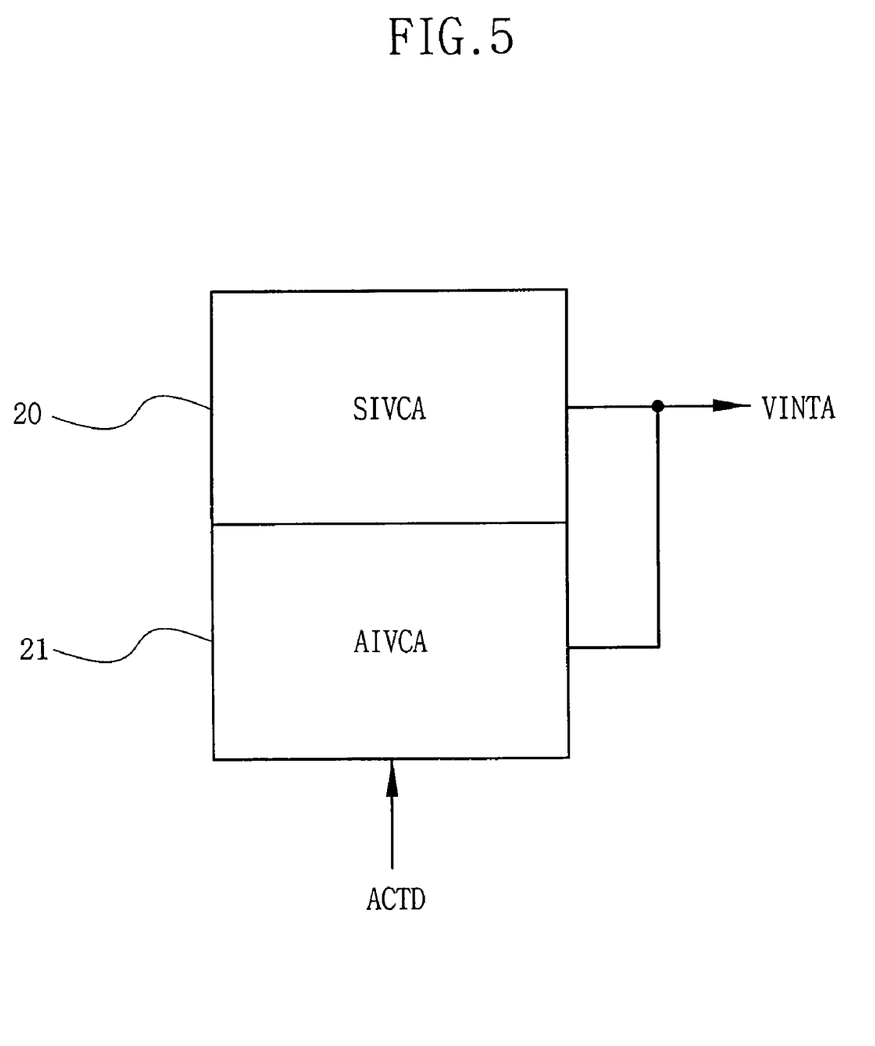
FIG. 5 is a block diagram illustrating an array internal power voltage generator according to a modified embodiment of the invention.

FIG. 5 is a block diagram illustrating an array internal power voltage generator according to an embodiment of the invention. Referring to FIG. 5, an array internal power voltage generator for active 21 and for stand-by internal power voltage generator 20 are commonly connected to an output pad providing an array internal power voltage VINTA. The active control signal ACTD is also applied to array internal power voltage generator for active 21.

Figure 6:
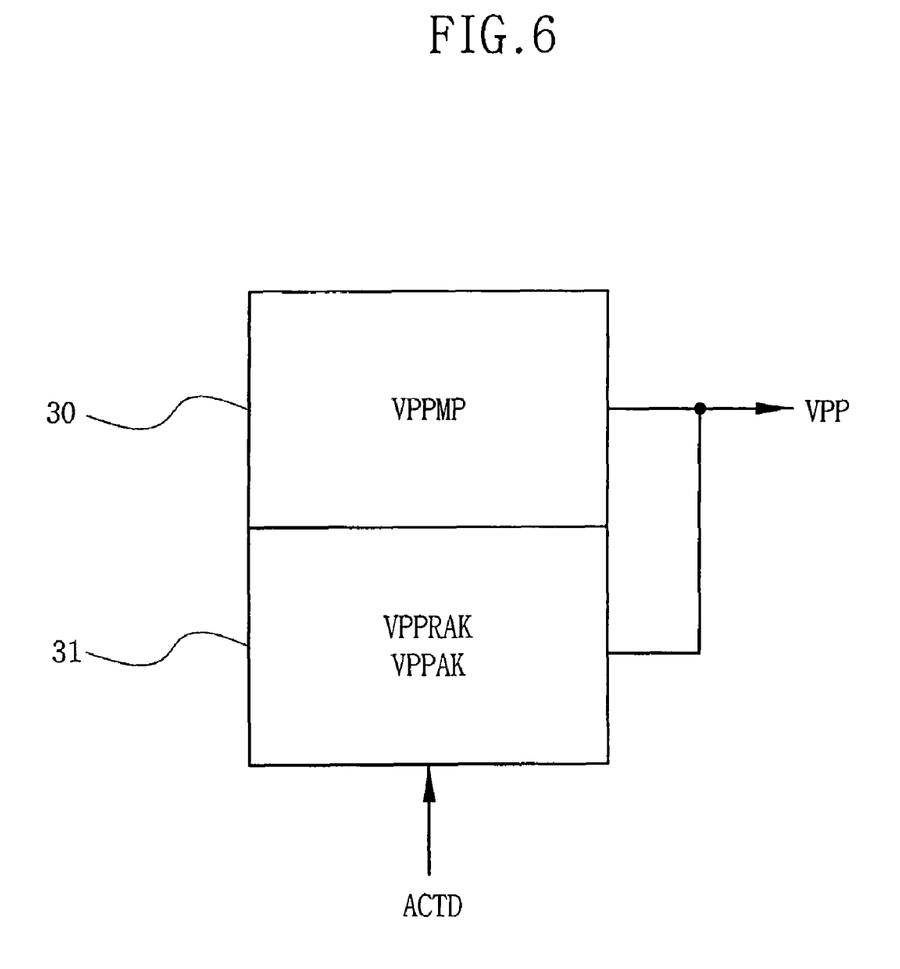
FIG. 6 is a block diagram illustrating a high voltage generator according to an extended embodiment of the invention.

FIG. 6 is a block diagram illustrating a high voltage generator according to an embodiment of the invention. Referring to FIG. 6, the high voltage generator comprises an active relation operation circuit 31 and a main pump 30 commonly connected to an output pad providing a high voltage VPP. The active control signal ACTD is also applied to the high voltage generator at active relation operation circuit 31.

Figure 7:
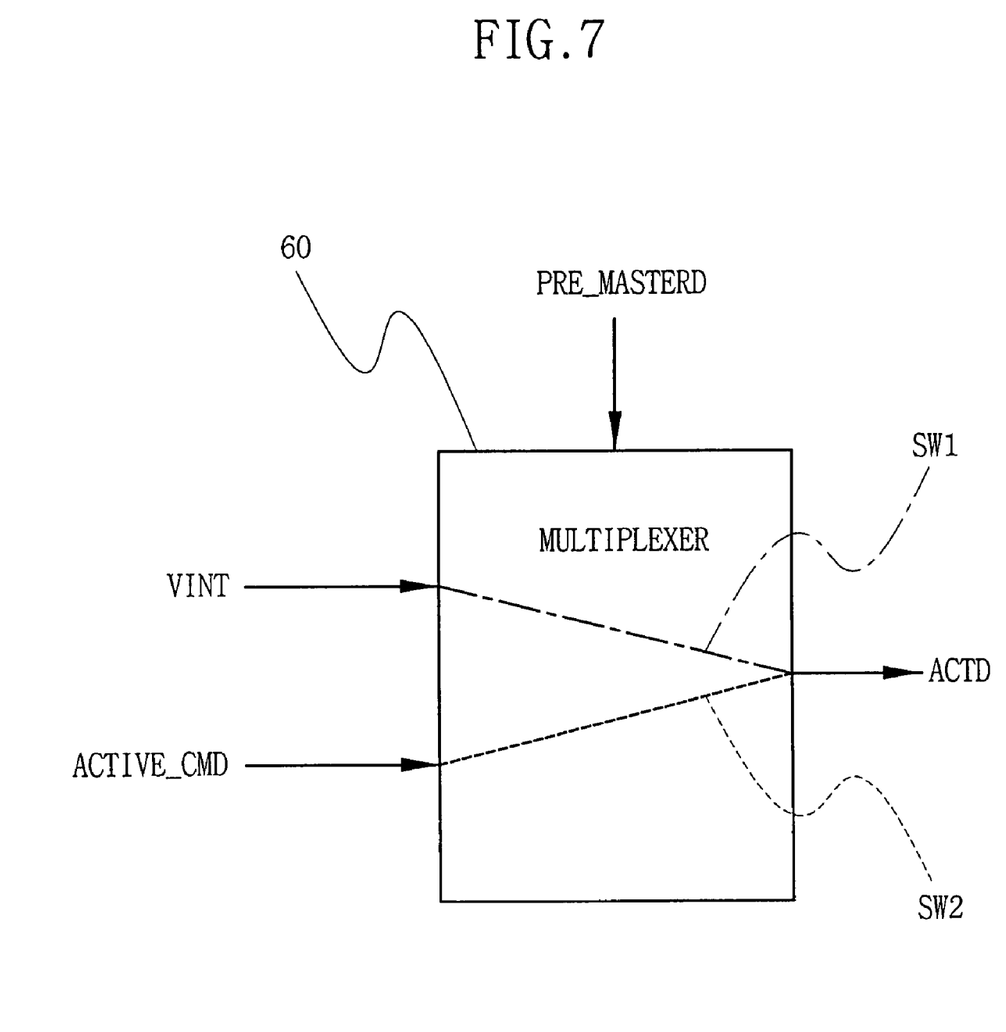
FIG. 7 is a block diagram illustrating an operation control signal generating part adapted to generate an operation control signal to be applied to FIGS. 4 to 6.

Active control signal ACTD may be obtained, for example, from an active control signal generator like the one shown in FIG. 7. FIG. 7 is a block diagram of an exemplary circuit adapted to generate the active control signal ACTD applied to FIGS. 4, 5, and 6. In FIG. 7, a multiplexer 60 receives the internal power voltage VINT as an input as gated by the transition of the power-up signal VCCH. Multiplexer 60 also receives a second input ACTIVE_CMD gated by receipt of an active command signal. In one embodiment, multiplexer 60 may be implemented as a clocked CMOS inverter or a CMOS transmission gate gated by a PRE_MASTERD signal.

Figure 8:
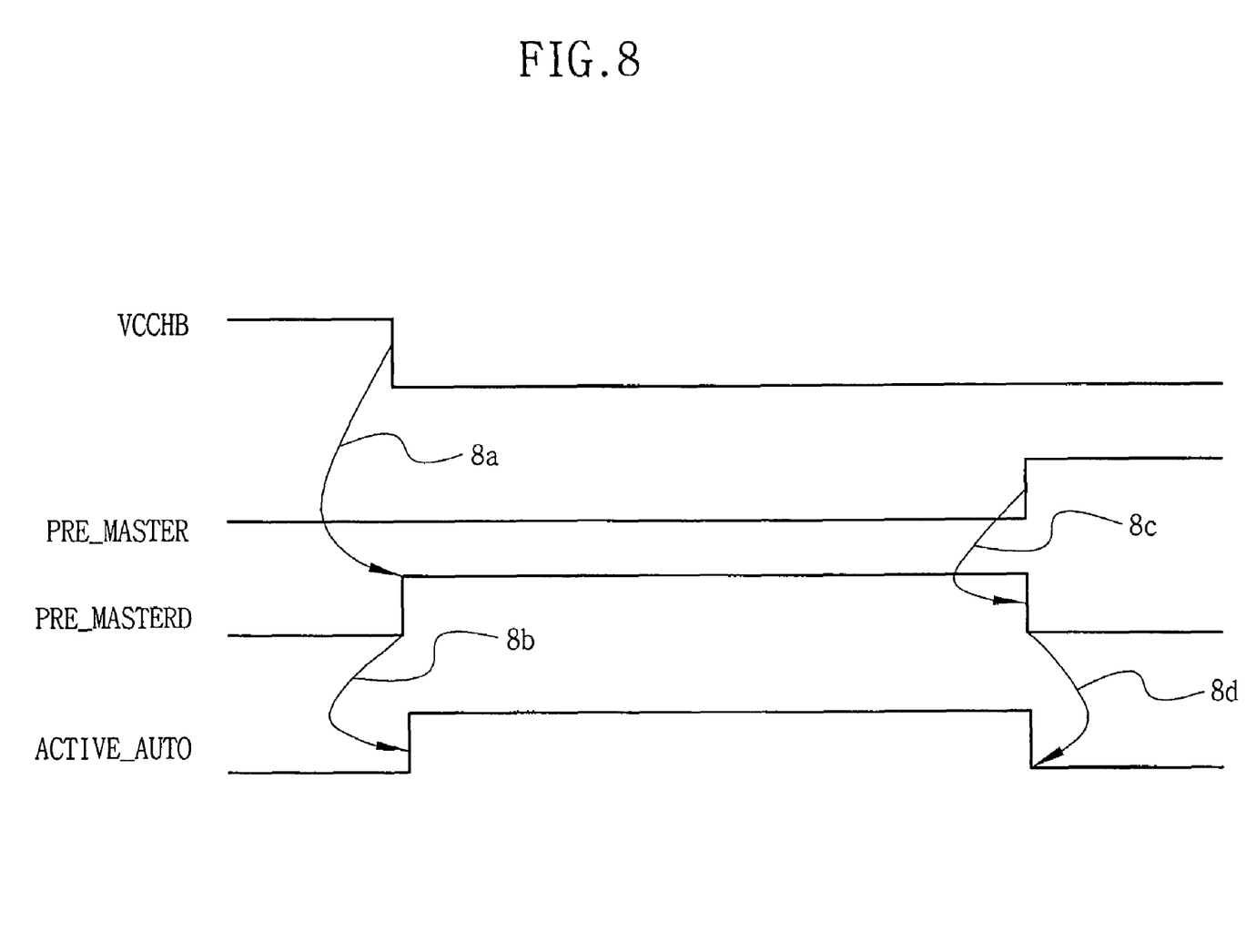
FIG. 8 is a timing diagram illustrating an operation control signal generation related to FIG. 7.

FIG. 8 is a timing diagram showing the temporal relationship for various control signals related to the active control signal generator of FIG. 7. Referring to FIG. 8, the PRE_MASTERD signal, as well as a related ACTIVE_AUTO signal, transitions from low to high (8a, 8b) when the inverse of the power-up bar signal VCCHB transitions from high to low. Thereafter, the PRE_MASTERD signal, and related signal ACTIVE_AUTO, transition back to low when where the PRE_MASTER signal transitions from low to high (8c, 8d).

Under these assumed relationships, the PRE_MASTERD signal may be applied to multiplexer 60 in FIG. 7 as an input selecting signal. In other words, multiplexer 60 functions as switch (SW1 verses SW2 positions) in relation to the PRE_MASTERD signal. Multiplexer 60 selects (SW1) the internal power voltage VINT when the PRE_MASTERD signal is high.

Figure 9:
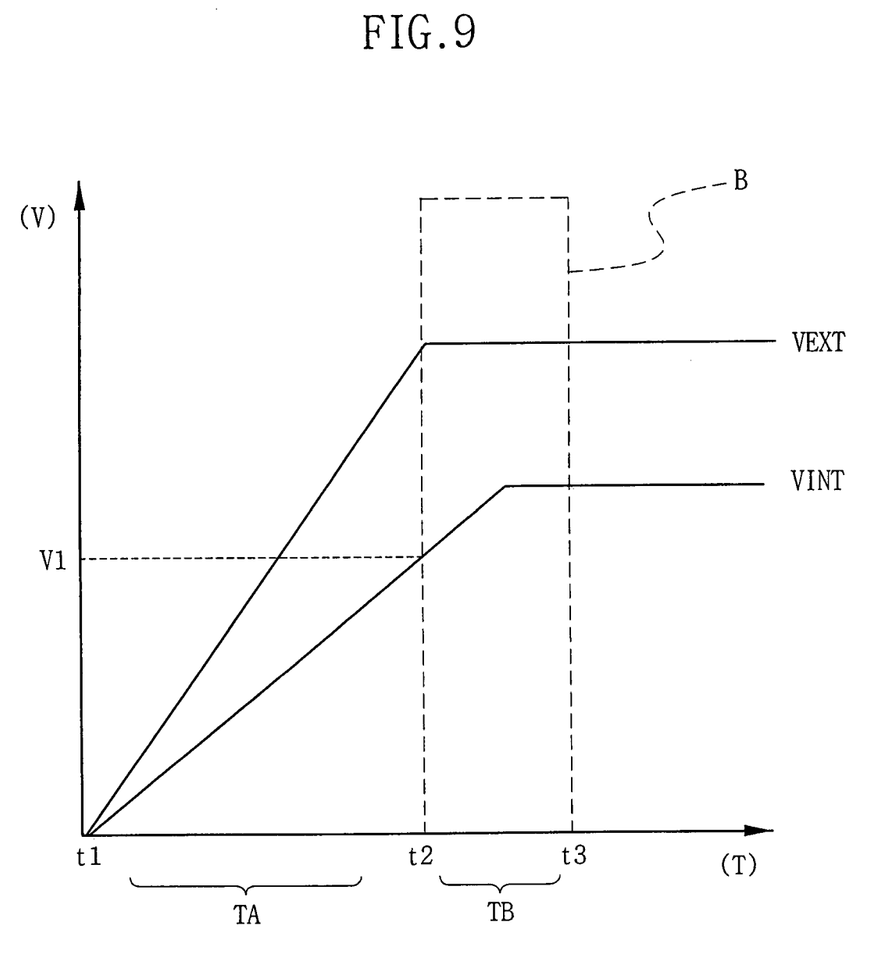
FIG. 9 is a schematic diagram illustrating a power-up slope of the internal power voltage generated by an operation in FIG. 4.

FIG. 9 is another power-up slope graph comparing the relative slopes of the internal power voltage VINT and the external power voltage VEXT in relation to operation of the circuit of FIG. 4. Referring to FIG. 9, during an internal power voltage generating operation, an internal power voltage generator continues working after time t2, up to time t3, to reinforce the power-up operation being applied to the internal power voltage VINT during period TB. As previously noted, the period TA between time t1 and t2 corresponds to the period during which the power-up signal VCCH is active. Thus, the power-up slope for internal power voltage VINT within first period TA is reinforced by power-up signal VCCH, and is thereafter additionally reinforced during a second period TB. Accordingly, the internal power voltage generator continues operation until time t3 without stopping at time point t2. Here again, time t2 is when the power-up signal VCCH (or its inverse) deactivates, and time t3 is when an active command signal is received in the memory device.

Figure 10:
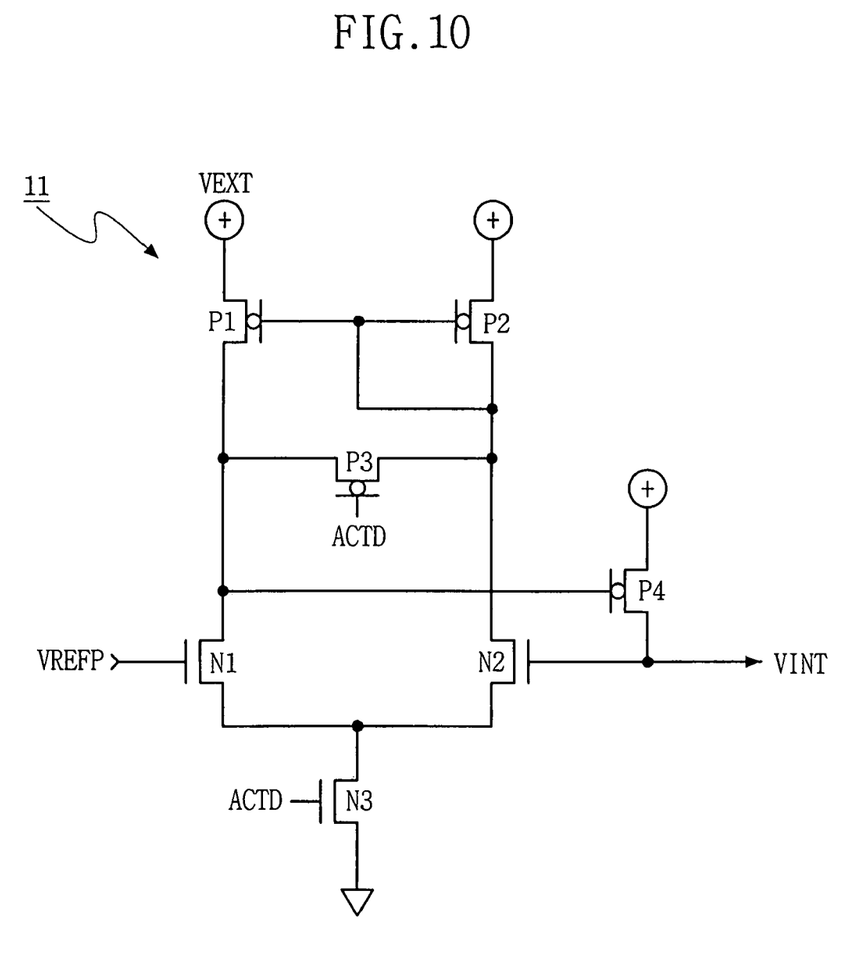
FIG. 10 is a circuit diagram illustrating an active internal power voltage generator according to an embodiment of the invention.

FIG. 10 is a circuit diagram illustrating one example of an active internal power voltage generator (AIVC) according to embodiment of the invention consistent with FIG. 4. Referring to FIG. 10, AIVC 11 comprises: P type and N type MOS transistors P1, P2, N1, N2 arranged in a current mirror type differential amplifier adapted to perform a comparator function. Drive P type MOS transistor P4 is adapted to output the internal power voltage VINT, as gated by a signal apparent at the drain of N type MOS transistor N1. The internal power voltage VINT is used to gate N type MOS transistor N2. P type transistor P3 is connected across the drains of N type MOS transistors N1 and N2 and is gated by the active control signal ACTD. Enable N type MOS transistor N3 is also gated by the active control signal ACTD.

In FIG. 10, N type MOS transistor N3 remains turned ON and P type MOS transistor P3 remains OFF when active control signal ACTD is high, prior to time t3. (See, FIG. 9) At time t3, the voltage level applied to the gate of N type MOS transistor N1 is higher than the voltage level applied to the gate of N type MOS transistor N2. That is, the level of the internal power voltage VINT has not yet reached the level of target voltage VREFP. Accordingly, N type MOS transistor N1 turns ON stronger than N type MOS transistor N2. P type MOS transistor P4 is turned ON to continue the internal power voltage generating operation supplying the external power voltage VEXT to the drain of P type transistor P1 when the gate voltage applied to P type MOS transistor P4 decreases. The internal power voltage generating operation of P type MOS transistor P4 continues until time t3.

Accordingly, the power-up of the internal power voltage VINT continues beyond the period defined by the activation period of power-up signal VCCH. In one embodiment, this continued reinforcing continues until an active command signal is received (e.g., an all bank precharge signal is applied). At this time, N type MOS transistor N3 in FIG. 10 is turned OFF, and equalizing P type MOS transistor P3 is turned ON. Since the P type MOS transistor P4 is turned OFF, the external power voltage VEXT is isolated to the output pad associated with the internal power voltage VINT.

Figure 11:
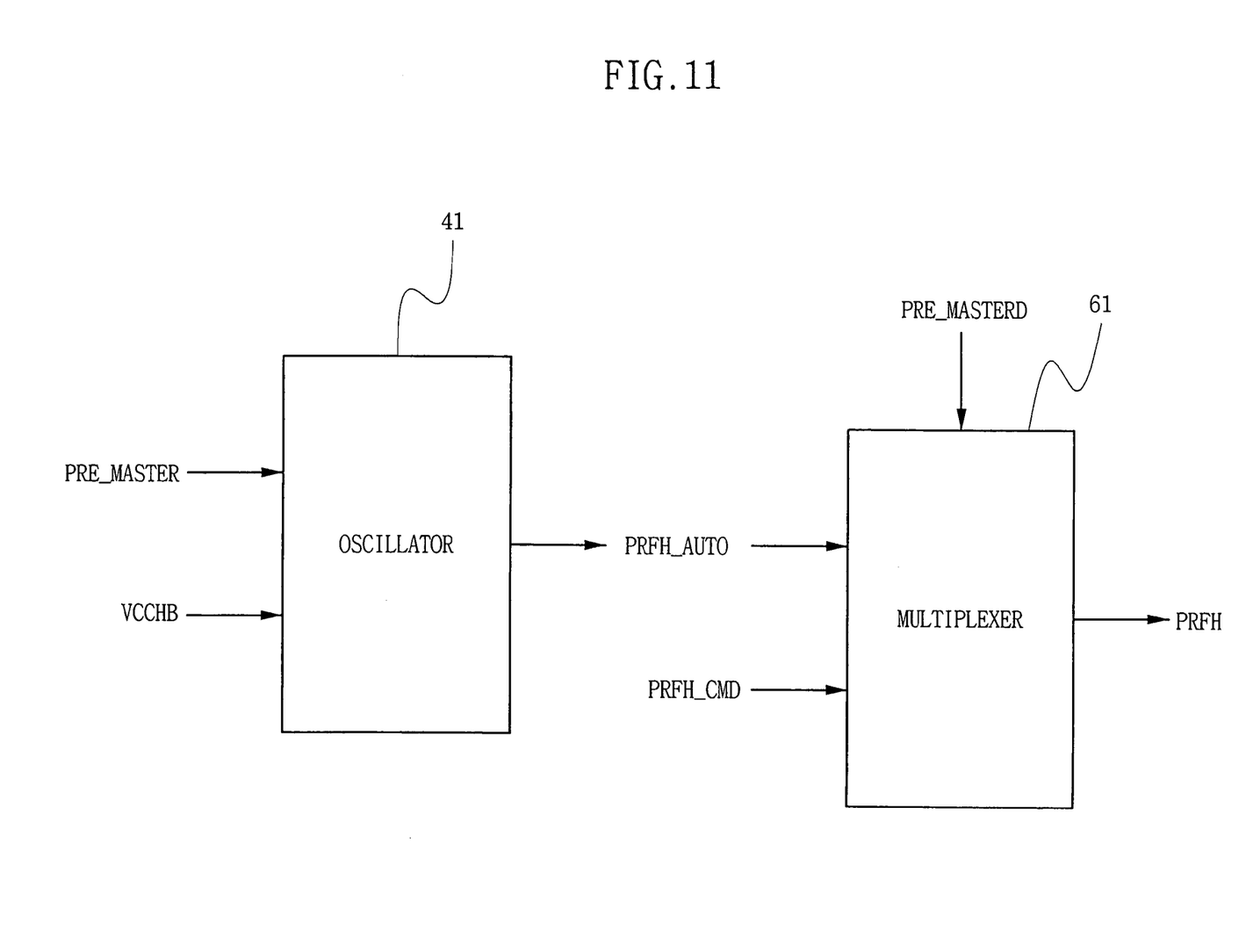
FIG. 11 is a circuit block diagram illustrating a power-up slope reinforcement of the internal power voltage according to an embodiment of the invention.
Figure 12:
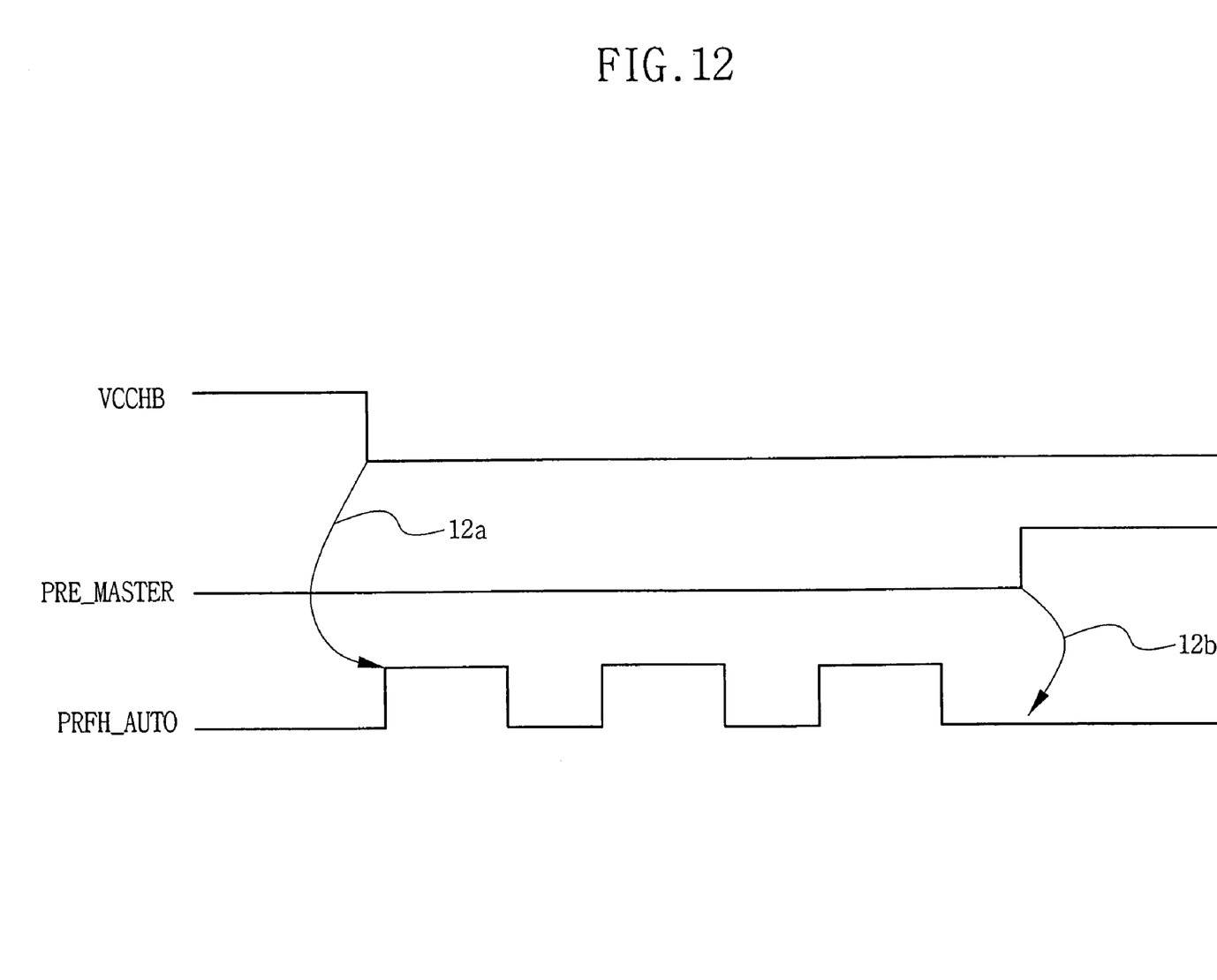
FIG. 12 is an operation timing diagram illustrating a signal generation related to FIG. 11.

FIG. 11 is a block diagram illustrating alternate approaches to the power-up slope reinforcement for the internal power voltage VINT according to embodiments of the invention. For example, the functional circuit may take the form of an oscillator 41 and a multiplexer 61. Also, FIG. 12 is a timing diagram illustrating the relationship for various signals related to the circuits of FIG. 11.

Assuming the inverse of the power-up signal VCCH transitions from high I to low, oscillator 41 performs a departure operation to generate an answering auto refresh enable pulse signal, PRFH_AUTO, (12a). Multiplexer 61 switches the auto refresh enable pulse as the output pulse, PRFH. Thus, multiplexer 61 output the received auto refresh enable pulse as the output pulse upon receipt of an externally applied command when the PRE_MASTERD signal is low. Accordingly, an apparatus automatically performs the auto refresh where the output pulse, the auto refresh master command is outputted as the auto refresh enable pulse. The operation of oscillator 41 is halted because the PRE_MASTERD signal transitions to high when an all bank pre-charge command is applied. At this time, multiplexer 61 receives a low PRE_MASTERD signal as a selecting signal. The PRE_MASTERD signal may be a signal resulting from the combination of an all bank precharge signal and a power-up master signal. In effect, the PRE_MASTERD signal shown in FIG. 8 may be used to improve the power-up slope of the internal power voltage VINT when applied to the embodiment shown in FIG. 11 to generate the active control signal ACTD as shown in FIG. 7.

Finally, although the present invention has been described in connection with the embodiments thereof, it is to be understood that the scope of the invention is not limited to only the disclosed embodiments. On the contrary, various modifications to the embodiments, as will be apparent to persons skilled in the art will fall within the scope of the invention as defined by the appended claims. For example, transistor substrate or multiplexer configuration may be variously modified.

What is claimed is:

1. An internal power voltage generating circuit comprising:
    an active control signal generating circuit adapted to select between an internal power voltage and an active command signal to generate an active control signal; and
    an internal power voltage generator adapted to power-up the internal power voltage in relation to an applied external power voltage during both first and second periods, the first period ending with deactivation of an applied power-up signal and the second period following the first period and ending with receipt of the active command signal.

2. The internal power voltage generating circuit of claim 1, wherein deactivation of the power-up signal is defined by transition of the power-up signal or its inverse from high to low.

3. The internal power voltage generating circuit of claim 1, wherein the active control signal generating circuit comprises a multiplexer gated by a selecting signal.

4. The internal power voltage generating circuit of claim 1, wherein the active command signal is an all bank pre-charge command signal.

5. The internal power voltage generating circuit of claim 3, wherein the active command signal is an all bank pre-charge command signal.

6. The internal power voltage generating circuit of claim 3, wherein the selecting signal is a PRE_MASTERD signal defined in relation to the power-up signal and the active command signal.

7. The internal power voltage generating circuit of claim 6, wherein the active command signal is an all bank pre-charge command signal.

8. The internal power voltage generator as claimed in claim 3 comprises a current mirror circuit comprising:
    a P type MOS transistor P1 receiving the external power supply and a P type MOS transistor P2, wherein the gates of P1 and P2 are commonly connected;
    an N type MOS transistor N1 gated by a target reference voltage and an N type MOS transistor N2, wherein the sources of N1 and N2 are commonly connected to the drain of an N type MOS transistor N3, wherein N3 is gated by the active control signal and the gate of N2 is connected to an output pad at which the internal power voltage is apparent;
    a P type MOS transistor P3 connected between the drains of N1 and N2 and a P type MOS transistor P4 gated by a voltage apparent at the drain of N1 and having a drain connected to the output pad at which the internal power voltage is apparent.

9. A method of generating an internal power voltage in a semiconductor memory device, comprising:
    receiving an external power voltage in an internal power voltage generating circuit and activating a power-up signal during a first period in the applied external power voltage rising to a desired level;
    powering-up the internal power voltage in relation to the external power voltage during the first period; and,
    continuing the power-up of the internal power voltage during a second period following the first period, the second period extending beyond the deactivation of the power-up signal until receipt of an active command signal.

10. The method of claim 9, wherein the active command signal is an all bank pre-charge command signal.

* * * * *